United States Patent
Park et al.

(10) Patent No.: US 11,275,465 B2
(45) Date of Patent: Mar. 15, 2022

(54) SELF-CHECKING CIRCUIT, TOUCH SENSING DEVICE, AND ELECTRONIC DEVICE

(71) Applicant: Samsung Electro-Mechanics Co., Ltd., Suwon-si (KR)

(72) Inventors: Jung Eui Park, Suwon-si (KR); Joo Yul Ko, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/060,554

(22) Filed: Oct. 1, 2020

(65) Prior Publication Data

US 2021/0247870 A1    Aug. 12, 2021

(30) Foreign Application Priority Data

Feb. 6, 2020  (KR) .................. 10-2020-0014300
Jul. 22, 2020  (KR) .................. 10-2020-0091154

(51) Int. Cl.
| | | |
|---|---|---|
| G06F 3/041 | (2006.01) | |
| G01R 31/28 | (2006.01) | |
| G06F 3/044 | (2006.01) | |
| H03K 17/955 | (2006.01) | |

(52) U.S. Cl.
CPC ....... *G06F 3/0416* (2013.01); *G01R 31/2829* (2013.01); *G06F 3/044* (2013.01); *H03K 17/955* (2013.01)

(58) Field of Classification Search
CPC ......... G06F 3/041–0488; G06F 3/0412; G06F 3/0446; G06F 3/0488; H03K 17/954; H03K 17/96; H03K 2217/96038; H03K 5/1252; H03K 2005/00247; H03K 2005/00273; H03K 19/003; H03K 5/135; H03K 17/962; H03K 2217/960715; H03K 2017/9606; H03K 17/9545
See application file for complete search history.

(56) References Cited

FOREIGN PATENT DOCUMENTS

| KR | 10-2013-0123068 A | 11/2013 |
|---|---|---|
| KR | 10-2013-0136358 A | 12/2013 |

*Primary Examiner* — Sanjiv D. Patel
(74) *Attorney, Agent, or Firm* — NSIP Law

(57) ABSTRACT

A self-checking circuit includes: an edge detector configured to output an edge detection signal having a pulse generated during detection of an edge of a pulse signal having a pulse train; a charging and discharging circuit configured to perform a charging operation and a discharging operation based on the edge detection signal to generate a detection voltage; and a comparison circuit configured to check whether the pulse signal is normal, based on the detection voltage, to output a checking signal.

27 Claims, 10 Drawing Sheets

SELF-CHECKING CIRCUIT, TOUCH SENSING DEVICE, AND ELECTRONIC DEVICE

CROSS-REFERENCE TO RELATED APPLICATIONS

This application claims the benefit under 35 USC § 119(a) of Korean Patent Application Nos. 10-2020-0014300 and 10-2020-0091154 filed on Feb. 6, 2020 and Jul. 22, 2020, respectively, in the Korean Intellectual Property Office, the entire disclosures of which are incorporated herein by reference for all purposes.

BACKGROUND

1. Field

The following description relates to a self-checking circuit, and a touch sensing device and an electronic device including a self-checking circuit.

2. Description of Related Art

In general, it is desirable that a wearable device be thin and have a simple, clean design. Therefore, existing mechanical switches have being used less frequently through not only implementation of dustproof and waterproof technologies but also development of seamless models having a tidy design.

Current technologies such as touch-on-metal (ToM) technology in which a metal surface is touched, a capacitance sensing method using a touch panel, a microelectromechanical system (MEMS), a micro strain gauge, and other technologies have been developed. In addition, a force touch function is under development.

In the case of an existing mechanical switch, a large size and an internal space are required to implement a switching function. Additionally, a design of wearable device including a mechanical switch may be somewhat untidy and a large amount of space may be required due to an outwardly protruding shape of the switch, since the structure of the switch is not integrated with an external case of the wearable device.

In addition, there is a risk of an electric shock due to direct contact with an electrically connected mechanical switch. Moreover, a structure of the mechanical switch makes it difficult to implement dustproofing and waterproofing.

To address the above issues, electronic touch switch devices have been developed. Such electronic touch switch devices may include a circuit configured to generate a reference signal or an oscillation signal. In addition, there is a requirement for a function or a circuit that is capable of internally checking whether an error in operation occurs in such a circuit configured to generate a reference signal or an oscillation signal.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a self-checking circuit includes: an edge detector configured to output an edge detection signal having a pulse generated during detection of an edge of a pulse signal having a pulse train; a charging and discharging circuit configured to perform a charging operation and a discharging operation based on the edge detection signal to generate a detection voltage; and a comparison circuit configured to check whether the pulse signal is normal, based on the detection voltage, to output a checking signal.

A pulse width of the pulse may be shorter than a pulse width of the pulse signal.

The charging and discharging circuit may include: a switch connected between a power supply voltage terminal and a ground; a capacitor connected between the switch and the ground, and configured to perform the charging operation when the switch is in an ON state; and a resistor connected between a connection node of the switch and the capacitor and the ground, and configured to provide a discharging path between the capacitor and the ground when the switch is in an OFF state.

The comparison circuit may include: a window comparison circuit configured to compare the detection voltage with a first reference voltage and a second reference voltage to output the checking signal to have a high level when the detection voltage is higher than the first reference voltage and a low level when the detection voltage is lower than the second reference voltage; and an output selector configured to perform a logical AND operation on an enable signal and the checking signal.

The charging and discharging circuit may include: a first current source connected between a power supply voltage terminal and a ground; a second current source connected between the first current source and the ground, and configured to be turned off when the first current source is turned on and turned on when the first current source is turned off; and a capacitor connected between an intermediate connection node between the first current source and the second current source and the ground, and configured to provide the detection voltage by performing a charging operation when the first current source is turned on and performing a discharging operation when the second current source is turned on.

In another general aspect, a touch sensing device for an electronic device including a touch switching unit includes: a sensing inductor disposed inside of a touch member disposed in a housing; a sensing capacitor electrically connected to the sensing inductor; an oscillation circuit including the sensing inductor and the sensing capacitor, and configured to generate an oscillation signal having a frequency varying depending on a touch input, including a touch-contact or touch-force, through the touch switching unit; a reference signal generation circuit configured to generate a reference signal corresponding to a reference clock; a signal processor configured to receive the reference signal from the reference signal generation circuit and detect whether a touch input has occurred, using the oscillation signal and the reference signal, to output a touch detection signal; and a self-checking circuit configured to check whether either one or both of the oscillation signal and the reference signal is normal, and provide a checking signal.

The self-checking circuit may include: a first checking circuit configured to check whether the oscillation signal is normal and provide a first checking signal; and a second checking circuit configured to check whether the reference signal is normal and provide a second checking signal.

The first checking circuit may include: a first edge detector configured to output a first edge detection signal having a pulse generated during detection of an edge of the oscillation signal; a first charging and discharging circuit configured to perform a charging operation and a discharging operation based on the first edge detection signal to generate a first detection voltage; and a first comparison circuit configured to check whether the oscillation signal is normal, based on the first detection voltage, to output a first checking signal.

The first comparison circuit may include: a window comparison circuit configured to compare the first detection voltage with a first reference voltage and a second reference voltage to output the first checking signal to have a high level when the first detection voltage is higher than the first reference voltage and a low level when the first detection voltage is lower than the second reference voltage; and an output selector configured to perform a logical AND operation on an enable signal and the first checking signal.

The first charging and discharging circuit may include: a first current source connected between a power supply voltage terminal and a ground; a second current source connected between the first current source and the ground to be turned off when the first current source is turned on and be turned on when the first current source is turned off; and a capacitor connected between an intermediate connection node between the first current source and the second current source and the ground to provide the first detection voltage by performing the charging operation when the first current source is turned on and performing the discharging operation when the second current source is turned on.

The second checking circuit may include: a second edge detector configured to output a second edge detection signal having a pulse generated during detection of an edge of the reference signal; a second charging and discharging circuit configured to perform a charging operation and a discharging operation based on the second edge detection signal to generate a second detection voltage; and a second comparison circuit configured to check whether the reference signal is normal, based on the second detection voltage, to output a second checking signal.

A pulse width of the pulse generated during the detection of the edge of the oscillation signal may be shorter than a pulse width of the oscillation signal, and a pulse width of the pulse generated during the detection of the edge of the reference signal may be shorter than a pulse with of the reference signal.

Each of the first and second charging and discharging circuits may include: a switch connected between a power supply voltage terminal and a ground; a capacitor connected between the switch and the ground to perform a charging operation when the switch enters an ON state; and a resistor connected between a connection node of the switch and the capacitor and the ground to provide a discharging path between the capacitor and the ground when the switch enters an OFF state.

The second comparison circuit may include: a window comparison circuit configured to compare the second detection voltage with a first reference voltage and a second reference voltage to output the second checking signal to have a high level when the second detection voltage is higher than the first reference voltage and a low level when the second detection voltage is lower than the second reference voltage; and an output selector configured to perform a logical AND operation on an enable signal and the second checking signal.

The second charging and discharging circuit may include: a first current source connected between a power supply voltage terminal and a ground; a second current source connected between the first current source and the ground to be turned off when the first current source is turned on and be turned on when the first current source is turned off; and a capacitor connected between an intermediate connection node between the first current source and the second current source and the ground to provide the second detection voltage by performing the charging operation when the first current source is turned on and performing the discharging operation when the second current source is turned on.

In another general aspect, an electronic device includes: a switching unit including a first touch member disposed in a housing; a sensing inductor disposed inside of the first touch member; a sensing capacitor electrically connected to the first sensing inductor; an oscillation circuit including the sensing inductor and the sensing capacitor and configured to generate an oscillation signal having a frequency varying depending on a touch input, including a touch-contact or touch-force, through the touch switching unit; a reference signal generation circuit configured to generate a reference signal corresponding to a reference clock; a signal processor configured to receive the reference signal from the reference signal generation circuit and detect whether a touch input has occurred, using the oscillation signal and the reference signal, to output a touch detection signal; and a self-checking circuit configured to check whether each of the oscillation signal and the reference signal is normal, and provide a check result signal.

The self-checking circuit may include: a first checking circuit configured to check whether the oscillation signal is normal and provide a first checking signal; and a second checking circuit configured to check whether the reference signal is normal and provide a second checking signal.

The first checking circuit may include: a first edge detector configured to output a first edge detection signal having a pulse generated during detection of an edge of the oscillation signal; a first charging and discharging circuit configured to perform a charging operation and a discharging operation based on the first edge detection signal to generate a first detection voltage; and a first comparison circuit configured to check whether the oscillation signal is normal, based on the first detection voltage, to output a first checking signal.

The first comparison circuit may include: a window comparison circuit configured to compare the first detection voltage with a first reference voltage and a second reference voltage to output a first checking signal to have a high level when the first detection voltage is higher than the first reference voltage and have a low level when the first detection voltage is lower than the second reference voltage; and an output selector configured to perform a logical AND operation on an enable signal and the first checking signal.

The first charging and discharging circuit may include: a first current source connected between a power supply voltage terminal and a ground; a second current source connected between the first current source and the ground to be turned off when the first current source is turned on and be turned on when the first current source is turned off; and a capacitor connected between an intermediate connection node between the first current source and the second current source and the ground to provide the first detection voltage by performing the charging operation when the first current source is turned on and performing the discharging operation when the second current source is turned on.

The second checking circuit may include: a second edge detector configured to output a second edge detection signal having a pulse generated during detection of an edge of the reference signal; a second charging and discharging circuit configured to perform a charging operation and a discharging operation based on the second edge detection signal to generate a second detection voltage; and a second comparison circuit configured to check whether the reference signal is normal, based on the second detection voltage, to output a second checking signal.

A pulse width of the pulse generated during the detection of the edge of the oscillation signal may be shorter than a pulse width of the oscillation signal. A pulse width of the pulse generated during the detection of the edge of the reference signal may be shorter than a pulse width of the reference signal.

Each of the first and second charging and discharging circuits may include: a switch connected between a power supply voltage terminal and a ground; a capacitor connected between the switch and the ground to perform a charging operation when the switch enters an ON state; and a resistor connected between a connection node of the switch and the capacitor and the ground to provide a discharging path between the capacitor and the ground when the switch enters an OFF state.

The second comparison circuit may include: a window comparison circuit configured to compare the second detection voltage with a first reference voltage and a second reference voltage to output the second checking signal to have a high level when the second detection voltage is higher than the first reference voltage and have a low level when the second detection voltage is lower than the second reference voltage; and an output selector configured to perform a logical AND operation on an enable signal and the second checking signal.

The second charging and discharging circuit may include: a first current source connected between a power supply voltage terminal and a ground; a second current source connected between the first current source and the ground to be turned off when the first current source is turned on and be turned on when the first current source is turned off; and a capacitor connected between an intermediate connection node between the first current source and the second current source and the ground to provide the second detection voltage by performing the charging operation when the first current source is turned on and performing the discharging operation when the second current source is turned on.

In another general aspect, an electronic device includes: a housing; a touch member disposed on the housing; and a circuit unit disposed inside the housing. The circuit unit is configured to: generate an oscillation signal having a frequency varying depending on a touch input through the touch member; generate a reference signal corresponding to a reference clock; detect whether a touch input has occurred, using the oscillation signal and the reference signal, to output a touch detection signal; generate pulses corresponding to detected edges of the oscillation signal and the reference signal; and determine whether the oscillation signal and the reference signal are normal based on the pulses.

The circuit unit may be further configured to: perform charging operations and discharging operations based on the pulses to generate detection voltages; and determine whether the oscillation signal and the reference signal are normal based on the detection voltages.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
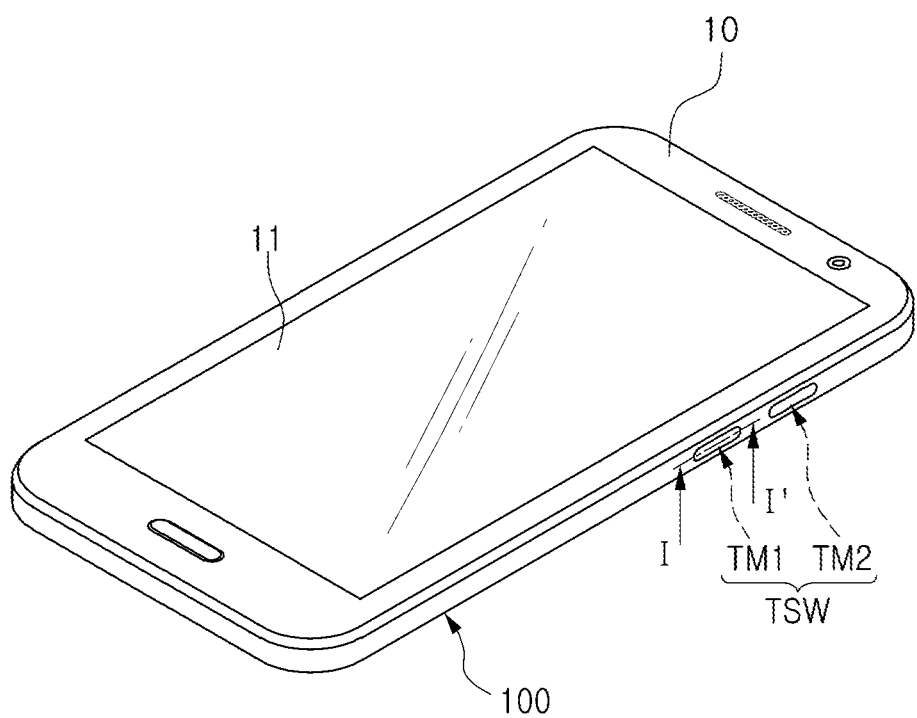
FIG. 1 is an exterior diagram of an electronic device, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is an exterior diagram of an electronic device 10, according to an example.

Referring to FIG. 1, the electronic device 10 may include a touchscreen 11, a housing 100, and a touch switching unit TSW.

The touch switching unit TSW may include a first touch member TM1 and a second touch member TM2 disposed in the housing 100 to replace a mechanical button, for example. Although the first touch member TM1 and the second touch member TM2 are illustrated in FIG. 1, this disclosure is not limited thereto, and the touch switching unit TSW may includes at least one first touch member TM1.

For example, referring to FIG. 1, the electronic device 10 may be a portable mobile device such as a smartphone, or a wearable device such as a smartwatch. However, the electronic device 10 is not limited to a specific device, and may be a portable or wearable electronic device, or an electronic device including a switch for operation control.

The housing 100 may be an external ease exposed outwardly of the electronic device. As an example, when a touch sensing device (described in more detail later) is applied to a mobile device, the housing 100 may be a cover disposed on a side surface of the electronic device 10. As an example, the housing 100 may be integrated with a cover disposed on a rear surface of the electronic device 10 or may be manufactured separately from a cover disposed on the rear surface of the electronic device 10, and then coupled to the cover disposed on the rear surface of the electronic device 10.

For example, referring to FIG. 1, the touch switching unit TSW may be disposed on the cover of an electronic device. In this case, the cover may be a cover other than the touchscreen 11, such as a side cover, a rear cover, a cover which may be provided on a portion of a front surface, or the like. For ease of description, the housing 100 will be described as being provided on the side cover as an example, but this disclosure is not limited to such an example.

In the following description, with respect to components having the same reference symbol and the same function in embodiments of respective drawings, unnecessary overlapping descriptions of such components may be omitted, while differences between embodiments of respective drawings may be described.

Figure 2:
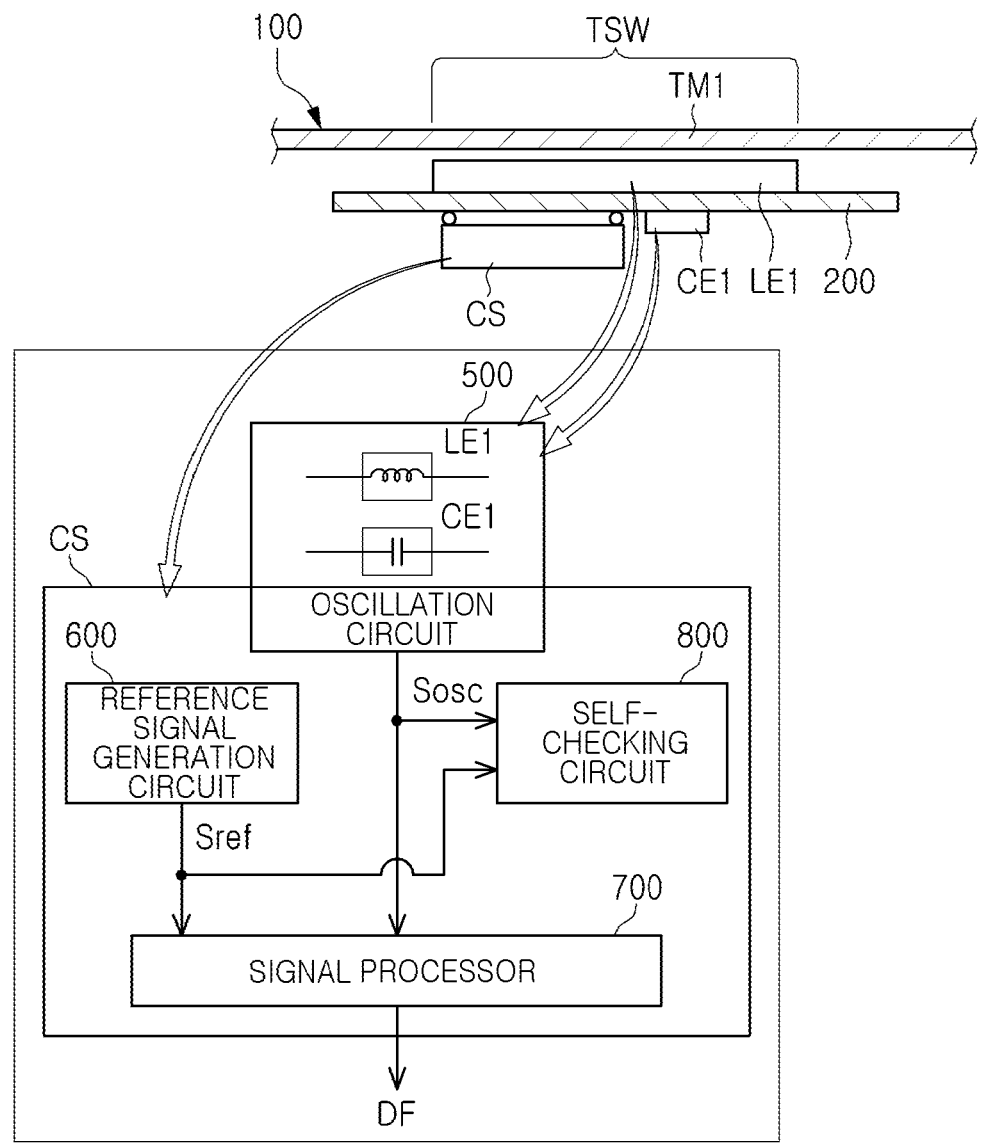
FIG. 2 is a cross-sectional view, taken along line I-I' in FIG. 1, illustrating an example of a structure and a touch sensing device of the electronic device in FIG. 1.

FIG. 2 is a cross-sectional view, taken along line I-I' in FIG. 1, illustrating an example of a structure of the electronic 10 device and a touch sensing device of the electronic device 10.

Referring to FIG. 2, the touch switching unit TSW may include a first touch member TM disposed on the housing 100. In FIG. 2 and subsequent drawings, the touch switching unit TSW is illustrated as including only one first touch member TM1. However, such illustrations are for merely for convenience, and the touch switching unit TSW is not limited to having a single touch member. The touch switching unit TSW may include a plurality of touch members having the same structure.

The touch sensing device may include a first sensing inductor LE1, a first capacitor CE1, an oscillation circuit 500, a reference signal generation circuit 600, a signal processor 700, and a self-checking circuit 800.

The first sensing inductor LE1 may be disposed inside of the first touch member TM1 (for example, inside of the housing 100). For example, the first sensing inductor LE1 may be mounted on one surface of a substrate 200 disposed inside of the housing 100. The first sensing inductor LE1 may be in contact with an internal surface of the first touch member TM1 or may be spaced apart from an internal surface of the first touch member TM1 by a predetermined distance.

The first capacitor CE1 may be electrically connected to the first sensing inductor LE1, and may be disposed on the one surface of the substrate 200 or on another surface of the substrate 200.

The oscillation circuit 500 may include the first sensing inductor LE1 and the first capacitor CE1, and may generate the oscillation signal Sosc having a frequency varying depending on a touch input (a touch-contact or touch-force) through the touch switching unit TSW.

For example, the oscillation circuit 500 may include a capacitance circuit having inductance varying when a touch-contact is applied through the first touch member TM1, and an inductance circuit having capacitance varying when touch-force is applied through the first touch member TM1. The first sensing inductor LE1 may be included in the capacitance circuit, and the first capacitor CE1 may be included in the inductance circuit.

The reference signal generation circuit 600 may generate a reference signal Sref corresponding to a reference clock CLK and may output the reference signal Sref to the signal processor 700.

The signal processor 700 may check whether each of the oscillation signal Sosc from the oscillation circuit 500 and the reference signal Sref from the reference signal generation circuit 600 is normal, and may provide an inspection result signal indicating a result of the checking of whether each of the oscillation signal Sosc and the reference signal Sref is normal.

In this application, the touch input may include both a touch-contact, which is a contact on an external surface of the first touch member TM1 that is not accompanied by force such as pressure, and a touch-force, which is a contact on the external surface of the first touch member TM1 that is accompanied by force pressing the external surface of the first touch member TM1 with pressure. For example, the touch input may be made to apply a touch-contact or to apply touch-force.

For example, a portion of the oscillation circuit 500 (for example, an amplifier circuit such as an inverter), the reference signal generation circuit 600, the signal processor 700, and the self-checking circuit 800 may be included in a circuit unit CS, and the circuit unit CS may be an integrated circuit.

As an example, the first sensing inductor LE1 may be disposed on one surface of the substrate 200 opposing an internal surface of the first touch member TM1. The circuit unit CS and the first capacitor CE1 may be disposed on the other surface of the substrate 200. The circuit unit CS, the first sensing inductor LE1, and the first capacitor CE1 may be electrically connected through the substrate 200.

The aforementioned disposition structure of the first sensing inductor LE1, the circuit unit CS, and the first capacitor CE1 is only an example, and the disclosure is not limited to such an example.

Referring to FIG. 2, as an example, the housing 100 may be formed of a conductive material such as a metal. The first touch member TM1 may be provided on the housing 100. As another example, the housing 100 may be formed of a non-conductive material such as plastic. In this case, the first touch member TM1 may be a non-conductive material or a conductive material.

The first sensing inductor LE1 may be, for example, an inductor including a printed circuit board (PCB) pattern, and may be an inductor component other than the PCB pattern. The first sensing inductor LE1 is only an example and is not limited thereto.

Figure 3:
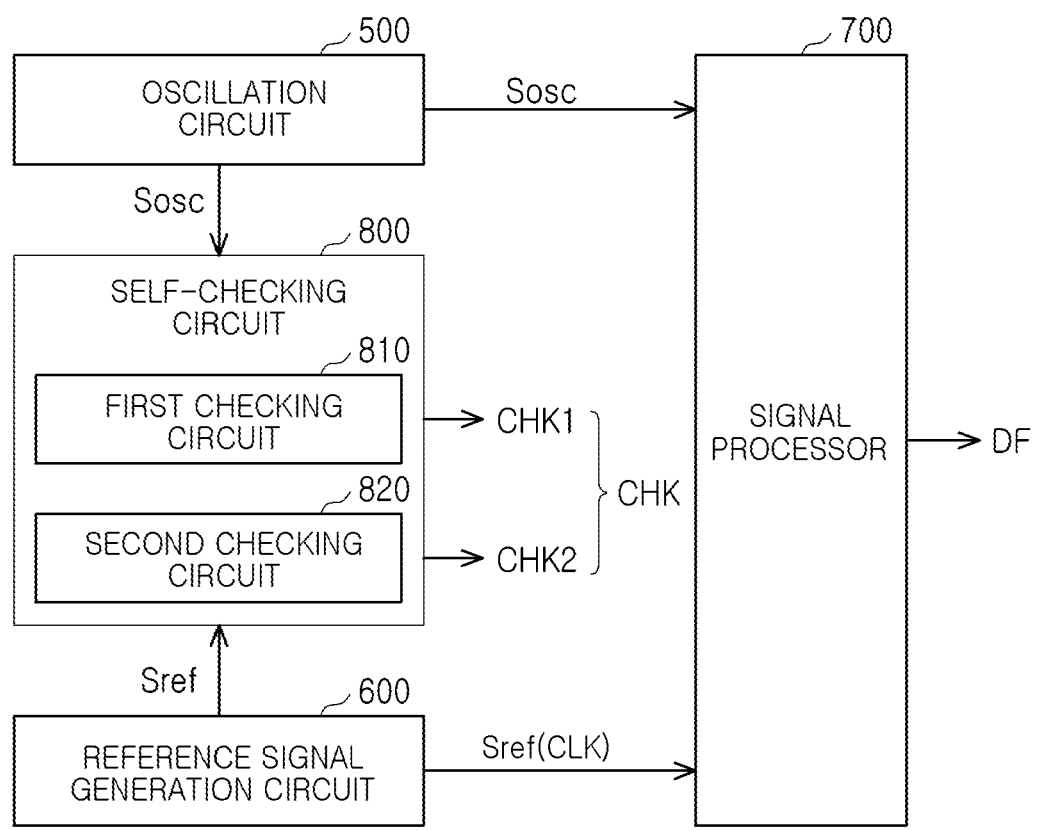
FIG. 3 illustrates an example of a touch sensing device.

FIG. 3 illustrates an example of a touch sensing device, according to this application.

Referring to FIG. 3, as described with reference to FIG. 2, the touch sensing device may include the oscillation circuit 500, the reference signal generation circuit 600, the signal processor 700, and the self-checking circuit 800.

The oscillation circuit 500 may generate the oscillation signal Sosc having a frequency varying depending on whether a touch input has occurred through the touch switching unit TSW, and may output the oscillation signal Sosc to the signal processor 700. In an example, the oscillation circuit 500 may be, for example, an LC oscillation circuit. However, the oscillation circuit 500 is not limited to an LC oscillation circuit. As an example, the oscillation circuit 500 may be an LC oscillation circuit using capacitance or inductance varying depending on a touch generated by a conductor such as a human hand.

The reference signal generation circuit 600 may generate a reference signal Sref and may output the reference signal Sref to the signal processor 700. As an example, the reference signal Sref may be a reference clock CLK having a preset frequency.

The signal processor 700 may detect whether a touch input has occurred, using the oscillation signal Sosc and the reference signal Sref, and may output a touch detection signal DF. As an example, when the touch input has occurred, the touch detection signal DF may be a signal having a high level.

For example, the signal processor 700 may count a cycle of the reference signal Sref and generate a count value using the oscillation signal Sosc, and may generate a touch detection signal DF depending on whether the touch is detected, based on the count value. A frequency of the reference signal Sref may be lower than a frequency of the oscillation signal Sosc.

For example, the self-checking circuit 800 may include a first checking circuit 810 configured to check an operation of the oscillation circuit 500, and a second checking circuit 930 configured to check an operation of the reference signal generation circuit 600.

The first checking circuit 810 may check whether the oscillation signal Sosc is normal, and may provide a first checking signal CHK1. As an example, the first checking circuit 810 may receive the oscillation signal Sosc to perform a charging operation and a discharging operation based on the oscillation signal Sosc to check whether the oscillation signal is normal.

The second checking circuit 820 may check whether the reference signal Sref is normal, and may provide a second checking signal CHK2. As an example, the second checking circuit 820 may receive the reference signal Sref to perform a charging operation and a discharging operation based on the reference signal Sref to check whether the reference signal Sref is normal.

In FIG. 3, the self-checking circuit 800 is illustrated as including the first checking circuit 810 and the second checking circuit 820. However, when a plurality of touch members are applied, a plurality of oscillation circuits corresponding to the touch members may be added. In this case, a plurality of checking circuits may be added.

The above-described touch sensing device senses a touch input through a change in the frequency output from the oscillation circuit, depending on whether the touch input has occurred, using LC resonance. A change in the frequency of an oscillation signal, including a frequency of the LC resonance, is configured to have high-sensitivity characteristics through digital signal processing such as counting the reference signal using the oscillation signal.

When the oscillation signal Sosc or the reference signal Sref is input to the signal processor 700, the signal processor 700 may determine an error based on the input signal. However, when a problem occurs in a final detection signal DF, it may be difficult to accurately determine whether the problem is an internal problem of the signal processor or a problem of the oscillation circuit 500 or the reference signal generation circuit 600.

In view of the above, in this disclosure, the self-checking circuit 800 is additionally provided. The self-checking circuit 800 is configured to check, separately from the signal processor 700, whether analog circuits such as the oscillation circuit 500 and the reference signal generation circuit 600 operate normally, based on the oscillation signal Sosc and the reference signal Sref.

As described above, in this disclosure, a check may be made as to whether outputs of the oscillation circuit 500 and the reference signal generation circuit 600 using the LC resonance operate normally.

Figure 4:
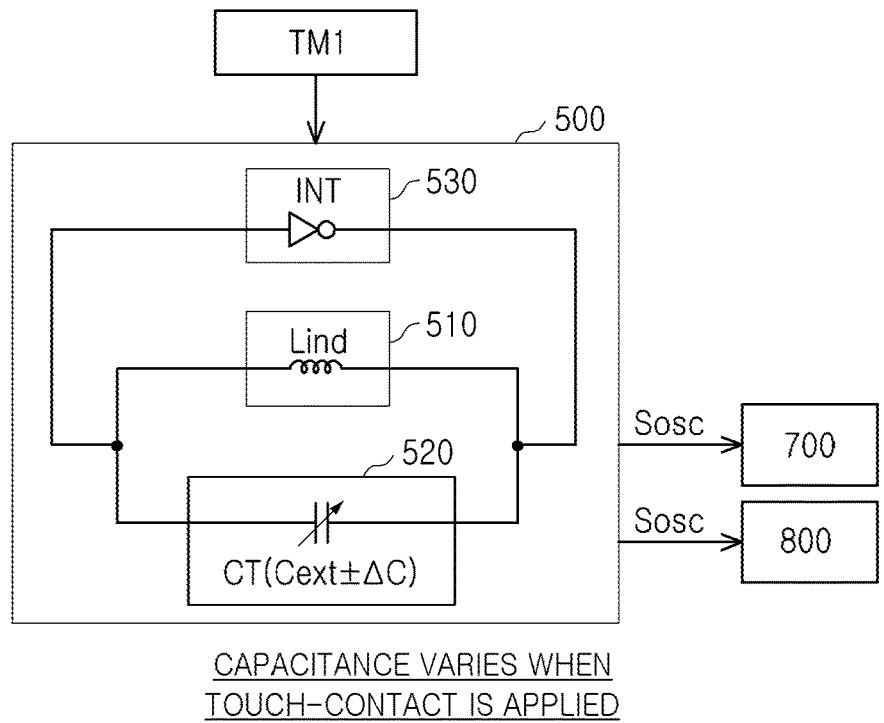
FIG. 4 illustrates an example of an oscillation circuit having variable capacitance when a touch-contact is applied.

FIG. 4 illustrates an example of the oscillation circuit 500 having variable capacitance when a touch-contact is applied. Referring to FIG. 4, the oscillation circuit 500 may include an inductance circuit 510, a capacitance circuit 520, and an amplifier circuit 530.

The inductance circuit 510 may include the first sensing inductor LE1 disposed spaced apart from an internal surface of the first touch member TM1, and may have inductance for resonance.

The capacitance circuit 520 may include a first capacitor CE1 connected to the inductance circuit 510, and may have capacitance varying when the first touch member TM1 is touched.

The amplifier circuit 530 may generate an oscillation signal Sosc having a resonant frequency determined by the first inductance circuit 510 and the first capacitance circuit 520. As an example, the amplifier circuit 530 may include at least one inverter or a differential amplifier circuit.

Hereinafter, an operation of the first oscillation circuit 500 when the first touch member TM1 is untouched will be described with reference to FIG. 4.

Referring to FIG. 4, the oscillation circuit 500 may be a parallel LC oscillation circuit including the inductance circuit 510 having inductance Lind of the first sensing inductor LE1, and the capacitance circuit 520 having capacitance Cext of the first capacitor CE1.

The oscillation circuit 500 may further include an amplifier circuit 530 configured to maintain or oscillate the LC resonance. As an example, the amplifier circuit 530 may include an inverter INT, but this application is not limited thereto.

As an example, a resonant frequency freq of the oscillation circuit 500 may be expressed by Equation 1 below.

$$freq \approx 1/\{2\pi sqrt(Lind*CT)\} \quad (1)$$

In Equation 1, denotes sameness or similarity, and the term "similarity" means that other values may be further included. In Equation 1, capacitance CT may be the capacitance Cext of the first capacitor CE1.

As illustrated in FIG. 4, in the capacitance circuit 520, additionally generated variable capacitance ΔC may be connected to the capacitance Cext of the first capacitor CE1 in parallel when a touch-contact of a conductor such as a human hand has not occurred.

As an example, the resonant frequency freq of the oscillation circuit 500 may be expressed by Equation 2 below.

$$fres \approx 1/\{2\pi sqrt(Lind*CT[Cext+\Delta C])\}$$

$$\Delta C \approx Ccase \| Cfinger \| Cgnd \quad (2)$$

In Equation 2, ≈ denotes sameness or similarity, and the term "similarity" means that other values may be further included. In Equation 2, the variable capacitance ΔC may be capacitance corresponding to a parallel sum of Ccase, Cfinger, and Cgnd, where Ccase is parasitic capacitance between a housing and the first sensing inductor LE1, Cfinger is capacitance of a human body, and Cgnd is ground return capacitance between circuit ground and earth.

In Equation 2, "∥" is defined as follows: "a∥b" is defined as a serial connection between "a" and "b" in a circuit, and a sum value thereof is calculated as "(a*b)/(a+b)". Such descriptions may be applied to Equation 3 below.

When comparing Equation 1 (a case in which a touch-contact has not occurred) and Equation 2 (a case in which a touch-contact has occurred), the capacitance Cext of Equation may be increased to the capacitance Cext+Δ of Equation 2. Accordingly, it is confirmed that a resonant frequency when the touch-contact has not occurred is lower than a resonant frequency when the touch-contact has occurred.

Figure 5:
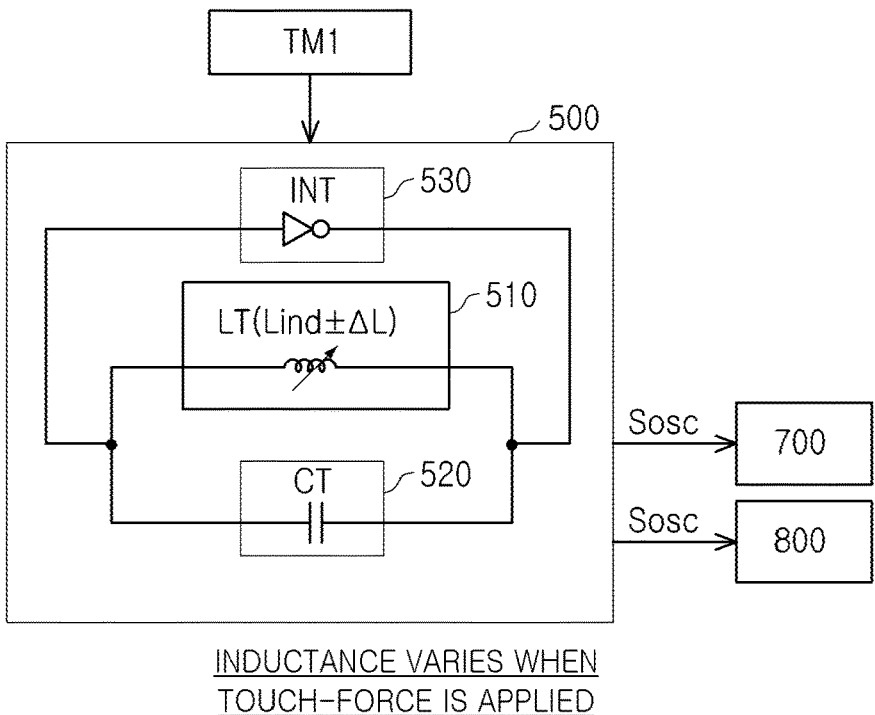
FIG. 5 illustrates an example of an oscillation circuit having variable capacitance when touch-force is applied.

FIG. 5 illustrates an example of an oscillation circuit having variable capacitance when touch-force is applied.

Referring to FIG. 5, as described above, the oscillation circuit 500 may be a parallel LC oscillation circuit including an inductance circuit 510 having the inductance Lind of the first sensing inductor LE1, and the capacitance circuit 520 having the capacitance Cext of the first capacitor CE1, as described with reference to FIG. 4.

The oscillation circuit 500 may further include the amplifier circuit 530 configured to maintain or oscillate LC resonance. As an example, the amplifier circuit 530 may include the inverter INT, but is not limited thereto.

As an example, a resonant frequency freq of the oscillation circuit 500 may be expressed Equation 3 below. In this case, the inductance LT in FIG. 5 may be inductance Lind of the first sensing inductor LE1.

In addition, as illustrated in FIG. 5, the inductance circuit 510 may be configured such that additionally generated variable inductance ΔL may be connected to the inductance Lind of the inductor LE1 when touch-force is applied by a human hand or the like.

As an example, the resonant frequency freq of the oscillation circuit 500 may be expressed by Equation 3 below.

$$fres \approx 1/\{2\pi sqrt(LT*CT)\} \quad (3)$$

where LT=(Lind −ΔL)

In Equation 3, denotes sameness or similarity, and the term "similarity" means that other values may be further included.

In Equation 3, a gap between a housing 100 and the first sensing inductor LE1 is changed as touch-force is applied, and an action of eddy current generated by the change in the gap causes the inductance of the first sensing inductor LE1 to be decreased (Lind −ΔL). Therefore, it is confirmed that the resonant frequency when the touch-force is not applied is increased to the resonant frequency when the touch-force is applied.

Figure 6:
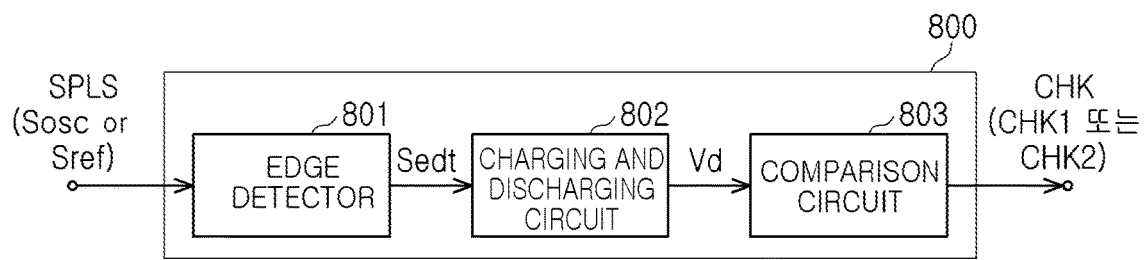
FIG. 6 illustrates a schematic diagram of a self-checking circuit in FIG. 2, according to an example.

FIG. 6 is a schematic diagram of the self-checking circuit 800, according to an example.

Referring to FIGS. 2 and 6, the self-checking circuit 800 may be applied to a touch sensing device applied to the electronic device 10.

The self-checking circuit 800 may include an edge detector 801, a charging and discharging circuit 802, and a comparison circuit 803.

The edge detector 801 may output an edge detection signal Sedt having a short pulse generated when an edge of a pulse signal SPLS having a pulse train is detected. As an example, the pulse signal SPLS may be an oscillation signal Sosc or a reference signal Sref. For example, the short pulse of the detection signal Sedt may have a shorter width than a pulse of a pulse signal SPLS.

The charging and discharging circuit 802 may perform a charging operation and a discharging operation based on the edge detection signal Sedt to generate a detection voltage Vd. As an example, the charging and discharging circuit 802 may repeatedly perform a charging operation and a discharging operation according to the edge detection signal Sedt, and may detect the detection voltage Vd generated by the repeated charging and discharging operations.

The comparison circuit 803 may check whether the pulse signal SPLS is normal, based on the detection voltage Vd, and may output a checking signal CHK. As an example, when the detection voltage Vd is higher than a first reference voltage, the comparison circuit 803 may have a high level indicating a normal state. In addition, when the voltage is lower than a second reference voltage, the comparison circuit 803 may output a checking signal CHK (CHK1 or CHK2) having a low level indicating an abnormal state.

Figure 7:
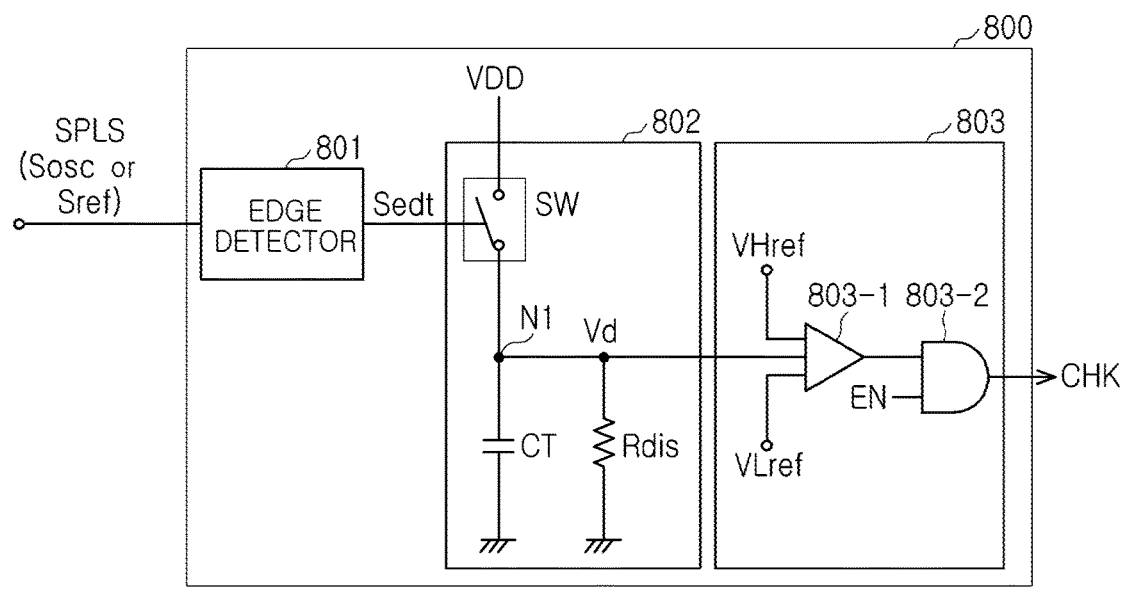
FIG. 7 is a circuit diagram of the self-checking circuit in FIG. 6, according to an example.

FIG. 7 is a circuit diagram of the self-checking circuit 800, according to an example.

The charging and discharging circuit 802 and the comparison circuit 803 may be implemented as illustrated in FIG. 6.

Referring to FIG. 7, for example, the charging and discharging circuit 802 may include a switch SW, a capacitor CT, and a resistor Rdis.

The switch SW may be connected between a power supply voltage (VDD) terminal and a ground, and may perform a switching operation such as an ON state or an OFF state using an edge detection signal Sedt from the edge detector 801.

The capacitor CT may be connected between the switch SW and the ground, and may perform a charging operation when the switch SW enters the ON state and a discharge operation when the switch SW enters the OFF state.

The resistor Rdis may be connected between a connection node N1 of the switch SW and the capacitor CT and the ground to provide a discharging path between the capacitor CT and the ground when the switch SW enters the OFF state.

For example, the comparison circuit 803 may include a window comparison circuit 803-1 and an output selector 803-2.

The window comparison circuit 803-1 may compare the detection voltage Vd with a first reference voltage VHref and a second reference voltage VLref to output a checking signal CHK having a high level when the detection voltage Vd is higher than the first reference voltage VHref and having a low level when the detection voltage Vd is lower than the second reference voltage VLref.

As an example, the first reference voltage VHref is a high-level determination reference voltage and the second reference voltage VLref is a low-level determination reference voltage. Accordingly, the first reference voltage VHref is higher than the second reference voltage VLref.

The output selector 803-2 may perform a logical AND operation on an enable signal EN and the checking signal CHK. As an example, the output selector 803-2 may include an AND gate, and may output the checking signal CHK when the enable signal EN has a high level and may not output the checking signal CHK when the enable signal EN has a low level.

As described above, the output selector 803-2 may control the output of the checking signal CHK based on the enable signal EN.

Figure 8:
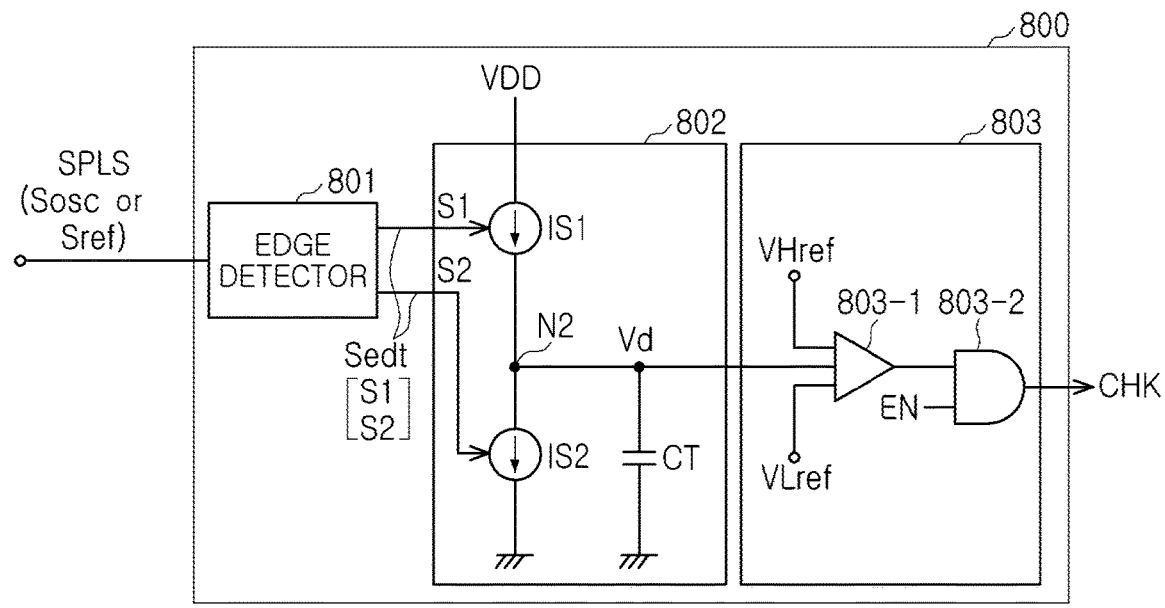
FIG. 8 is a circuit diagram of a self-checking circuit in FIG. 6, according to another example.

FIG. 8 is a circuit diagram of the self-checking circuit 800, according to another example.

The charging and discharging circuit 802 illustrated in FIG. 6 may be implemented as illustrated in FIG. 8.

Referring to FIG. 8, for example, the charging and discharging circuit 802 may include a first current source IS1, a second current source IS2, and the capacitor CT.

The first current source IS1 may be connected between the power supply voltage (VDD) terminal and the ground to be turned on or off based on switching signals S1 and S2 included in the edge detection signal Sedt from an edge detector 801. The first current source 151 may generate current for charging in the turned-on state. As an example, the switching signal S1 may be a signal having the same phase as the edge detection signal Sedt, and switching signal S2 may be a signal having a phase opposite to a phase of the edge detection signal Sedt.

The second current source IS2 may connected between the first current source IS1 and the ground to be turned off when the first current source IS1 is turned on and to be turned on when the first current source IS1 is turned OFF, and may generate current for discharging the capacitor CT in the turned-on state.

The capacitor CT may be connected between an intermediate connection node N2 of the first current source IS1 and the second current source IS2 and a ground to perform a charging operation when the first current source IS1 is turned on and to perform a discharging operation when the second current source IS2 is turned on, and thus, may provide the detection voltage Vd.

Figure 9:
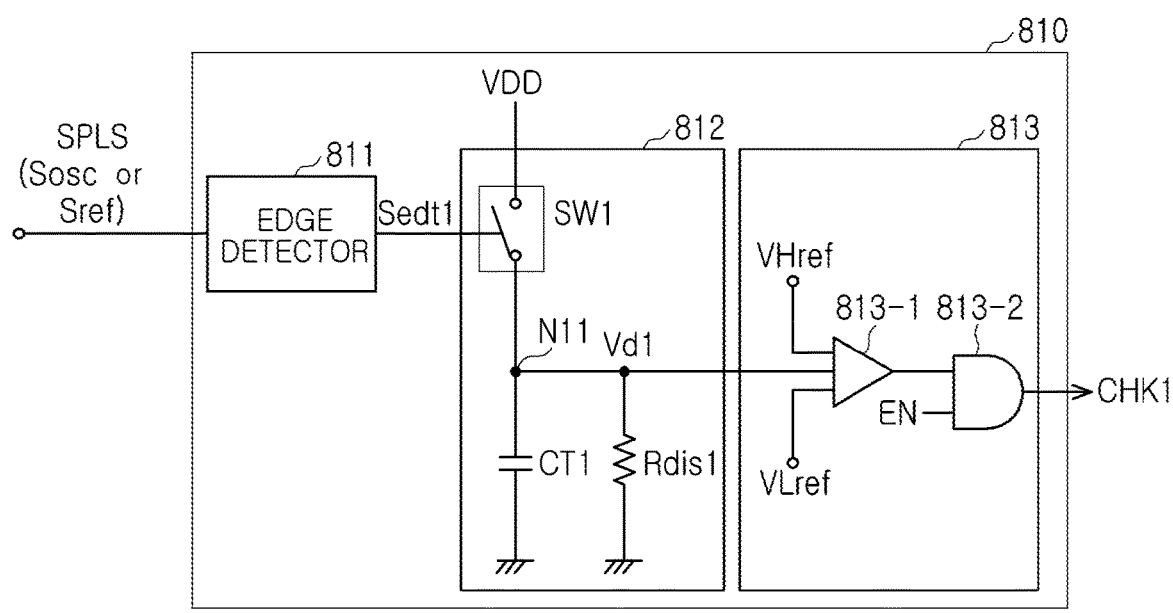
FIG. 9 is a circuit diagram of a first checking circuit in FIG. 3, according to an example.

FIG. 9 is a circuit diagram of the first checking circuit 810 of FIG. 3, according to an example.

Referring to FIG. 9, the first checking circuit 810 may include a first edge detector 811, a first charging and discharging circuit 812, and a first comparison circuit 813.

The edge detector 811 may output a first edge detection signal Sedt1 having a short pulse generated when an edge of the oscillation signal Sosc is detected. As an example, the first edge detector 811 may detect the edge of the oscillation signal Sosc to output a high-level pulse signal having a shorter pulse width than the oscillation signal Sosc, each time the edge of the oscillation signal Sosc is detected.

The first charging and discharging circuit 812 may perform a charging operation and a discharging operation based on a first edge detection signal Sedt1 of the edge detector 811 to generate a first detection voltage Vd1.

As an example, the first charging and discharging circuit 812 may include a first switch SW1 and a first capacitor CT1, connected between a power supply voltage (VDD) terminal and a ground in series, and a first resistor Rdis1 connected between a connection node N11 of the first switch SW1 and the first capacitor CT1 and the ground.

In the first charging and discharging circuit 812, the first switch SW1 enters an ON state or an OFF state according to a pulse signal input from the first edge detector 811. When the first switch SW1 enters the ON state, a voltage is charged in the first capacitor CT1. When the first switch SW1 enters the OFF state, a first detection voltage Vd1 charged in the first capacitor CT1 is discharged through the first resistor Rdis1.

The first comparison circuit 813 may check whether the oscillation signal Sosc is normal, based on the first detection voltage Vd1, to output a first checking signal CHK1.

As an example, the first comparison circuit 813 may include a window comparison circuit 813-1 and an output selector 813-2.

The window comparison circuit 813-1 may compare the first detection voltage Vd1 with a first reference voltage VHref and a second reference voltage VLref to output the first checking signal CHK1 having a high level when the first detection voltage Vd1 is higher than the first reference voltage VHref and having a low level when the first detection voltage Vd1 is lower than the second reference voltage VLref. A level of the first checking signal CHK1 is not limited to the above description, and may be opposite to the above description.

The output selector 813-2 may perform a logical AND operation on an enable signal EN and the first checking signal CHK1. As an example, the output selector 813-2 may include an AND gate and may output the first checking signal CHK1 when the enable signal EN has a high level and may not output the first checking signal CHK1 when EN has a low level.

As described above, the output selector 813-2 may control the output of the first checking signal CHK1 based on the enable signal EN.

Figure 10:
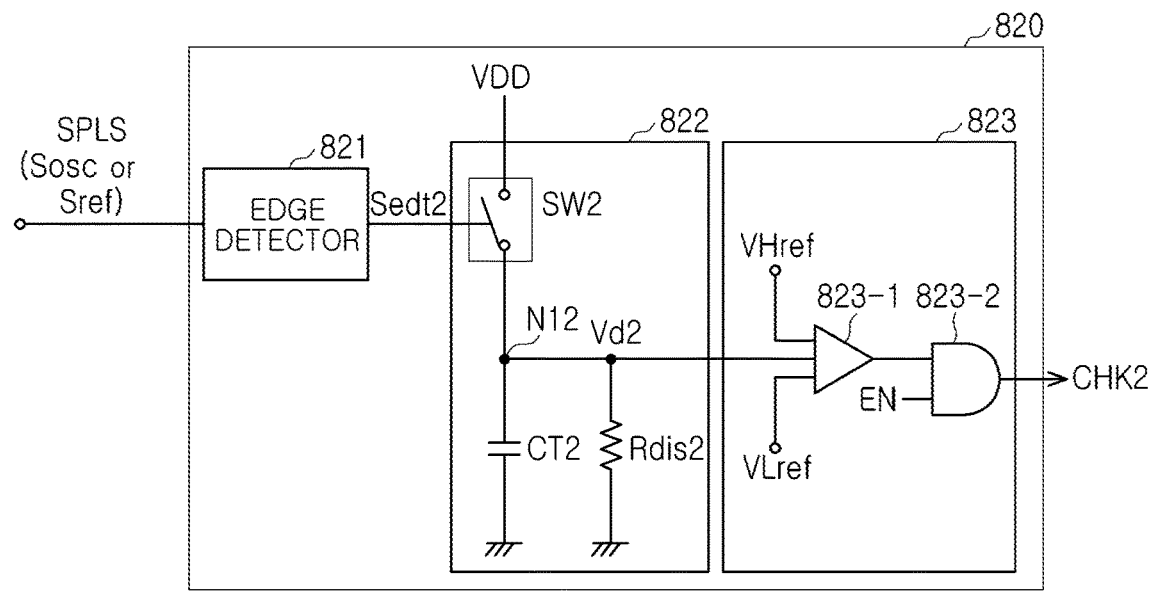
FIG. 10 is a circuit diagram of a second checking circuit in FIG. 3, according to an example.

FIG. 10 is a circuit diagram of the second checking circuit 820 in FIG. 3, according to an example.

Referring to FIG. 10, the second checking circuit 820 may include a second edge detector 821, a second charging and discharging circuit 822, and a second comparison circuit 823.

The second edge detector 821 may output a second edge detection signal Sedt2 having a short pulse generated when an edge of the reference signal Sref is detected. As an example, the second edge detector 821 may detect the edge of the reference signal Sref to output a high-level pulse signal, having a shorter pulse width than the reference signal Sref, each time the edge of the reference signal Sref is detected.

First and second edge detectors 811 and 821 may detect a rising edge and a falling edge of an input signal, and may detect one of the rising edge and the falling edge.

A short pulse of the first detection signal Sedt1 may have a shorter pulse width than the oscillation signal Sosc, and the short pulse of the second detection signal Sedt2 may have a shorter pulse width than the reference signal Sref.

The second charging and discharging circuit 822 may perform a charging operation and a discharging operation based on the second edge detection signal Sedt2 input from the second edge detector 821, to generate a second detection voltage Vd2.

As an example, the second charging and discharging circuit 822 may include a second switch SW2 and a second capacitor CT2, connected between a power supply voltage (VDD) terminal and a ground in series, and a second resistor Rdis1 connected between a connection node N12 of the second switch SW2 and the second capacitor CT2 and the ground.

In the second charging and discharging circuit 822, the second switch SW2 enters an ON state or an OFF state according to a pulse signal input from the second edge detector 821. When the second switch SW2 enters the ON state, a voltage is charged in the second capacitor CT2. When the second switch SW2 enters the OFF state, a voltage VCT2 charged in the second capacitor CT2 is discharged through the second resistor Rdis2.

The second comparison circuit 823 may check whether the reference signal Sref is normal, based on the second detection voltage Vd2, to output a second checking signal CHK2.

As an example, the second comparison circuit 823 may include a window comparison circuit 823-1 and an output selector 823-2.

The window comparison circuit 823-1 may compare the detection voltage Vd2 with a first reference voltage VHref and a second reference voltage VLref to output the second checking signal CHK2 having a high level when the second detection voltage Vd2 is higher than the first reference voltage VHref, and having a low level when the second detection voltage Vd2 is lower than the second reference voltage VLref. A level of the second checking signal CHK2 is not limited to the above description, and may be opposite to the above description.

The output selector 823-2 may perform a logical AND operation on an enable signal EN and the second comparison circuit checking signal CHK2. As an example, the output selector 823-2 may include an AND gate and may output the second checking signal CHK2 when the enable signal EN has a high level and may not output the second checking signal CHK2 when the enable signal EN has a low level.

As described above, the output selector 823-2 may control the output of the second checking signal CHK2 based on the enable signal EN.

Figure 13:
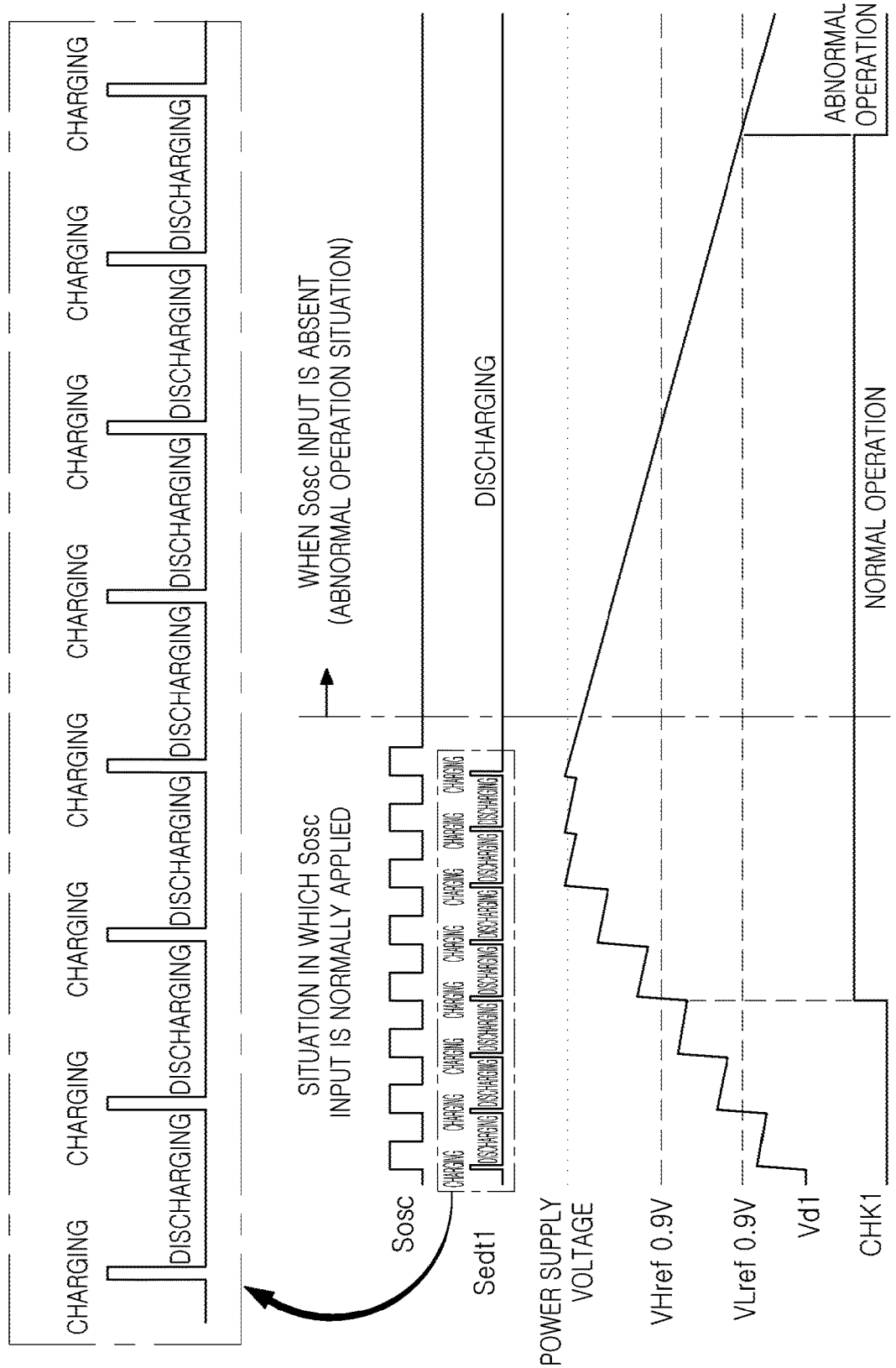
FIG. 13 is a waveform diagram of main signals and a voltage of the first checking circuit in FIG. 9, according to an example.
Figure 14:
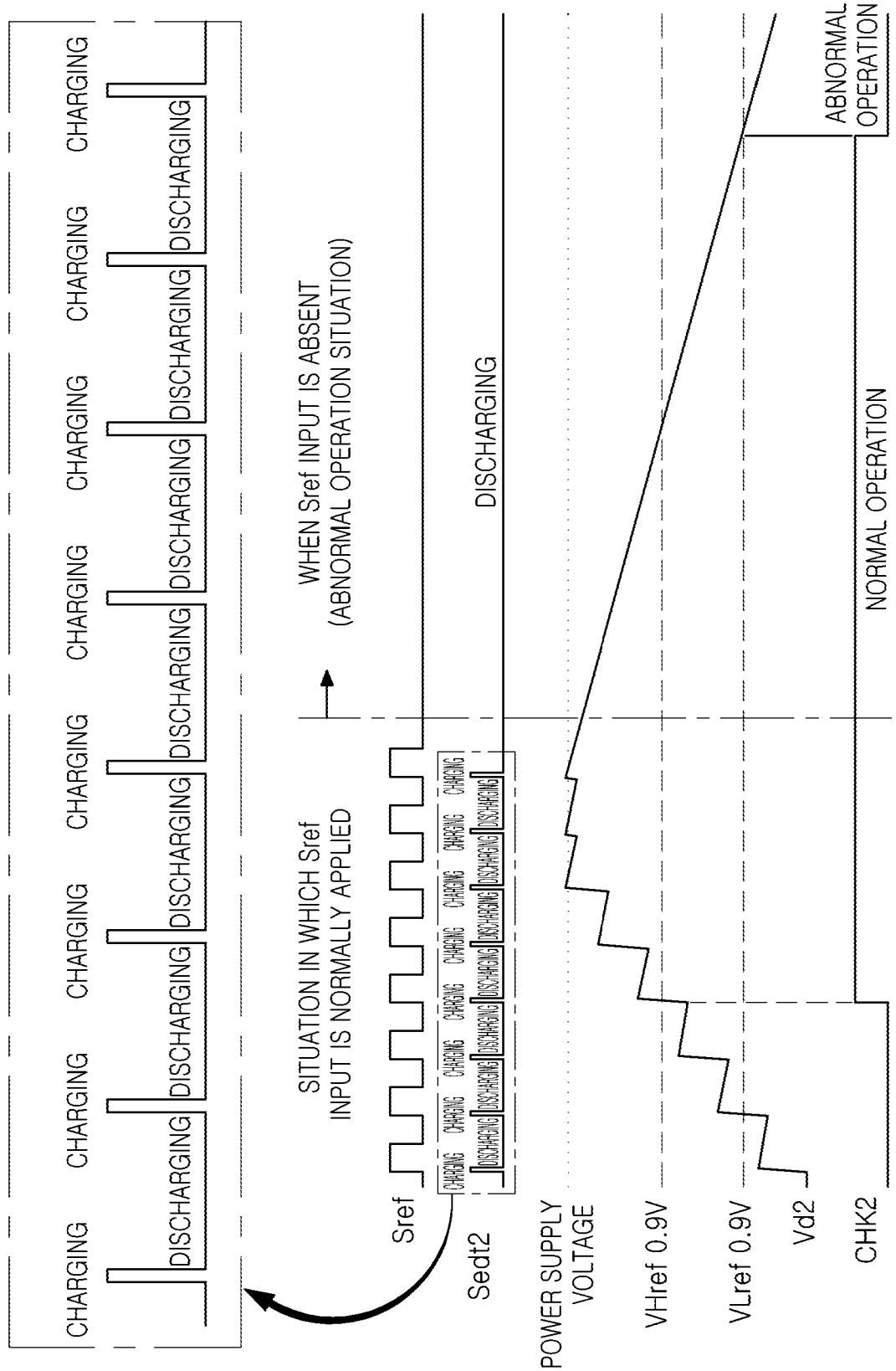
FIG. 14 is a waveform diagram of main signals and a voltage of the second checking circuit in FIG. 10, according to an example.

Additionally, in the self-checking circuit 800, the first edge detector 811 or the second edge detector 821 may detect an edge (at least one of rising and falling edged) of an oscillation signal or a reference signal and may generate a switching signal having a short pulse corresponding to the edge. The first charging and discharging circuit 812 or the second charging and discharging circuit 822 charges a corresponding capacitor CT1 or CT2 with electric charges through high current during a high-level period of a switching signal input from the first edge detector 811 or the second edge detector 821, and discharges the electric charges with current as significantly low as leakage current during a low-level period of the switching signal. Thus, the first detection voltage Vd1 or the second detection voltage Vd2 charged in the capacitor appears in a waveform as illustrated in FIG. 13 or 14. By using a window comparison circuit having a hysteresis, the comparison circuit 813 or 823 recognizes that an operation is normal when the first detected voltage Vd1 or the second detected voltage Vd2 becomes higher than or equal to the first reference voltage VHref and recognizes that an operation is abnormal when the first detected voltage Vd1 or the second detected voltage Vd2 becomes lower than or equal to the second reference voltage VLref.

Therefore, when the oscillation signal Sosc of the oscillation circuit 500 and/or a reference signal Sref of a reference signal generation circuit 600 is normally output, an edge-detected pulse signal is generated to accumulate electric charges of a corresponding capacitor. As a result, the first detection voltage Vd1 or the second detection voltage Vd2 is continuously increased to generate a signal indicating that an output signal of a check target circuit is normal.

In contrast, when a problem occurs in the oscillation circuit 500 or the reference signal generation circuit 600, and the signals output from the oscillation circuit and the reference signal generation circuit are maintained at a low level or a high level, an edge-detected pulse signal is not generated. Therefore, a corresponding capacitor CT1 or CT2 is continuously discharged to cause the first detection voltage Vd1 to be lower than the second reference voltage VLref for determining a low level of the comparison circuit 813 or 823 and to generate the first signal CHK 1 or the second signal CHK 2 indicating that an output of the first checking circuit 810 or the second checking circuit 820 is an abnormal operation.

Figure 11:
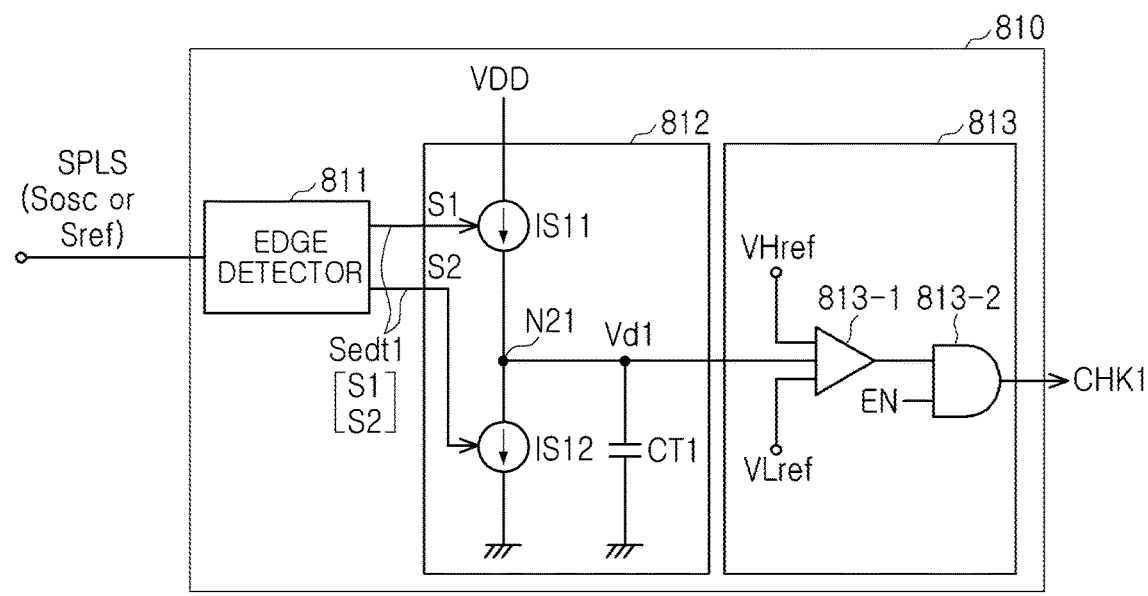
FIG. 11 is a circuit diagram of the first checking circuit in FIG. 3, according to an example.

FIG. 11 is a circuit diagram of the first checking circuit 810 in FIG. 3, according to another example.

The configuration of the first checking circuit 810 as illustrated in FIG. 11, is different from the configuration of the first checking circuit 810 as illustrated in FIG. 9, in the configuration of the first charging and discharging circuit 812. Therefore, the following description of FIG. 11 will focus on the first charging and discharge circuit 812.

Referring to FIG. 11, the first charging and discharging circuit 812 may include a first current source IS11, a second current source IS22, and the first capacitor CT1.

The first current source IS11 may be connected between the power supply voltage (VDD) terminal and the ground to be turned on or off based on signals S1 and S2 from the first edge detector 811. The first current source IS11 may generate current for charging the first capacitor CT1 in the turned-on state.

The second current source IS12 may be connected between the first current source IS11 and a ground to be turned off when the first current source IS11 is turned on and to be turned on when the first current source IS11 is turned off. The second current source IS12 may generate current for charging the first capacitor CT1 in the turned-on state.

The first capacitor CT1 may be connected between an intermediate connection node N21 of the first current source IS1 and the second current source IS2 and the ground to perform a charging operation when the first current source IS11 is turned on, and may perform a discharging operation when the second current source IS12 is turned on, and thus, may provide a first detection voltage Vd1.

Figure 12:
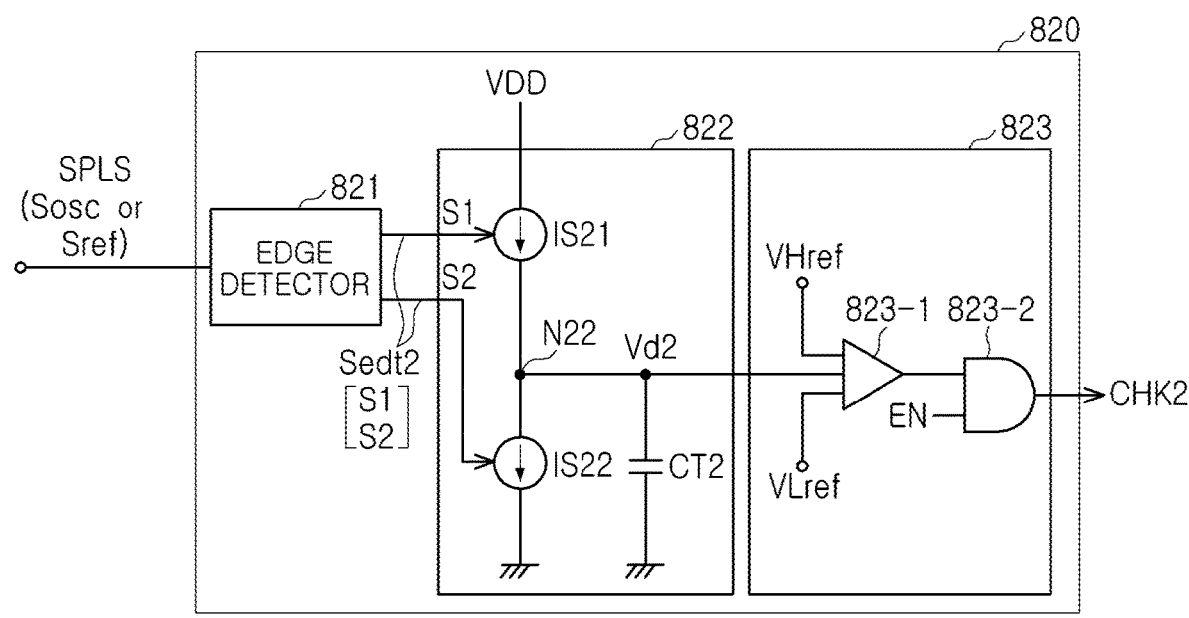
FIG. 12 is a circuit diagram of the second checking circuit in FIG. 3, according to an example.

FIG. 12 is a circuit diagram of the second checking circuit 820 in FIG. 3, according to an example.

The configuration of the second checking circuit 820 as illustrated in FIG. 12, is different from the configuration of the second checking circuit 820 as illustrated in FIG. 10, in the configuration of the second charging and discharging circuit 822. Therefore, the following description of FIG. 12 will focus on the second charging and discharge circuit 822.

Referring to FIG. 12, the second charging and discharging circuit 822 may include a first current source IS21, a second current source IS22, and the second capacitor CT2.

The first current source IS21 may be connected between the power supply voltage (VDD) terminal and the ground to be turned on or off based on signals S1 and S2 from the second edge detector 821. The first current source IS21 may generate current for charging the second capacitor CT2 in the turned-on state.

The second current source IS22 may be connected between the first current source IS21 and the ground to be turned off when the first current source IS21 is turned on and to be turned on when the first current source IS21 is turned off. The second current source IS22 may generate current for discharging the second capacitor CT2 in the turned-on state.

The second capacitor CT2 may be connected between an intermediate connection N22 of the first current source IS21 and the second current source IS22 and the ground to perform a charging operation when the first current source IS21 is turned on and to perform a discharging operation when the second current source IS22 is turned on, and thus, may provide the second detection voltage Vd2.

FIG. 13 is a waveform diagram of main signals and a voltage of the first checking circuit 812 in FIG. 9, according to an example.

Referring to FIGS. 9 and 13, when the oscillation signal Sosc has a normal pulse, the first edge detector 811 may output the first edge detection signal Sedt1 having a repeated short pulse. Thus, the first detection voltage Vd1 charged in the first capacitor CT1 may be increased according to the charging and discharging operations of the first capacitor CT1. As a result, the first comparison circuit 813 may output the first checking signal CHK1 having a high level, indicating a normal operation, when the first detection voltage Vd1 is higher than the first reference voltage VHref. In such a normal state, the first detection voltage Vd1 charged in the first capacitor CT1 is increased to the power supply voltage VDD, and is then maintained.

When the oscillation signal Sosc does not have a pulse, which is an abnormal case, the first edge detector 811 may not output the first edge detection signal Sedt1 having a repeated short pulse. Accordingly, the first detection voltage Vd1 charged in the first capacitor CT1 is continuously decreased, and thus, the first comparison circuit 813 may generate the first checking signal CHK1 having a low level, indicating an abnormal operation, when the first detection voltage Vd1 is lower than the second reference voltage VLref.

Additionally, FIG. 13 illustrates signal and voltage waveforms according to an operation example, but time required until an output of a checking circuit is valid may vary depending on setting of a length of a high-level period of the first 812 checking circuit, the magnitude of current charged and discharged in the first edge detector 811, and the first and second reference voltages VHref and VLref of the first comparison circuit 813. Such detailed examples may be modified according to usage environments of applicable system and products.

FIG. 14 is a waveform diagram of main signals and a voltage of the second checking circuit 822 in FIG. 10, according to an example.

Referring to FIGS. 10 and 14, when the reference signal Sref has a normal pulse, the second edge detector 821 may output the second edge detection signal Sedt2 having a repeated short pulse. Thus, the second detection voltage Vd2 charged in the second capacitor CT2 may be increased according to the charging and discharging operations of the second capacitor CT2. As a result, the second comparison circuit 823 may output the second checking signal CHK2 having a high level, indicating a normal operation, when the second detection voltage Vd2 is higher than the first reference voltage VHref. In such a normal state, the second detection voltage Vd2 charged in the second capacitor CT2 is increased to the power supply voltage VDD, and is then maintained.

When the reference signal Sref does not have a pulse, which is an abnormal case, the second edge detector 821 may not output the second edge detection signal Sedt2 having a repeated short pulse. Accordingly, the second detection voltage Vd2 charged in the second capacitor CT2 is continuously decreased, and thus, the second comparison circuit 823 may generate the second checking signal CHK2 having a low level, indicating an abnormal operation, when the second detection voltage Vd2 is lower than the second reference voltage VLref.

As described above, when a checking circuit is included, an abnormal state or a normal state of a circuit, generating a frequency of an oscillation circuit, a reference signal generation circuit, or the like, may be detected when an operation of the circuit starts. In addition, a normal state or an abnormal state may be detected even during a touch sensing operation.

According to the disclosure herein, a touch sensing device, which is an electronic switch device replacing a mechanical switch, may internally check whether a circuit generating a reference signal or an oscillation signal operates normally.

Thus, causes of malfunction or poor operation of the touch sensing device may be detected. In addition, a rapid response to such causes may be made.

The signal processor 700, the edge detector 801, the first edge detector 811, and the second edge detector 821 in FIGS. 1 to 14 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in forms and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A self-checking circuit, comprising:
   an edge detector configured to output an edge detection signal having a pulse generated during detection of an edge of a pulse signal having a pulse train;
   a charging and discharging circuit configured to perform a charging operation and a discharging operation based on the edge detection signal to generate a detection voltage; and
   a comparison circuit configured to check whether the pulse signal is normal, based on the detection voltage, to output a checking signal.

2. The self-checking circuit of claim 1, wherein a pulse width of the pulse is shorter than a pulse width of the pulse signal.

3. The self-checking circuit of claim 1, wherein the charging and discharging circuit comprises:
   a switch connected between a power supply voltage terminal and a ground;
   a capacitor connected between the switch and the ground, and configured to perform the charging operation when the switch is in an ON state; and
   a resistor connected between a connection node of the switch and the capacitor and the ground, and configured to provide a discharging path between the capacitor and the ground when the switch is in an OFF state.

4. The self-checking circuit of claim 1, wherein the comparison circuit comprises:
a window comparison circuit configured to compare the detection voltage with a first reference voltage and a second reference voltage to output the checking signal to have a high level when the detection voltage is higher than the first reference voltage and a low level when the detection voltage is lower than the second reference voltage; and
an output selector configured to perform a logical AND operation on an enable signal and the checking signal.

5. The self-checking circuit of claim 1, wherein the charging and discharging circuit comprises:
a first current source connected between a power supply voltage terminal and a ground;
a second current source connected between the first current source and the ground, and configured to be turned off when the first current source is turned on and turned on when the first current source is turned off; and
a capacitor connected between an intermediate connection node between the first current source and the second current source and the ground, and configured to provide the detection voltage by performing a charging operation when the first current source is turned on and performing a discharging operation when the second current source is turned on.

6. A touch sensing device for an electronic device including a touch switching unit, the touch sensing device comprising:
a sensing inductor disposed inside of a touch member disposed in a housing;
a sensing capacitor electrically connected to the sensing inductor;
an oscillation circuit including the sensing inductor and the sensing capacitor, and configured to generate an oscillation signal having a frequency varying depending on a touch input, including a touch-contact or touch-force, through the touch switching unit;
a reference signal generation circuit configured to generate a reference signal corresponding to a reference clock;
a signal processor configured to receive the reference signal from the reference signal generation circuit and detect whether a touch input has occurred, using the oscillation signal and the reference signal, to output a touch detection signal; and
a self-checking circuit configured to check whether either one or both of the oscillation signal and the reference signal is normal, and provide a checking signal.

7. The touch sensing device of claim 6, wherein the self-checking circuit comprises:
a first checking circuit configured to check whether the oscillation signal is normal and provide a first checking signal; and
a second checking circuit configured to check whether the reference signal is normal and provide a second checking signal.

8. The touch sensing device of claim 7, wherein the first checking circuit comprises:
a first edge detector configured to output a first edge detection signal having a pulse generated during detection of an edge of the oscillation signal;
a first charging and discharging circuit configured to perform a charging operation and a discharging operation based on the first edge detection signal to generate a first detection voltage; and
a first comparison circuit configured to check whether the oscillation signal is normal, based on the first detection voltage, to output a first checking signal.

9. The touch sensing device of claim 8, wherein the first comparison circuit comprises:
a window comparison circuit configured to compare the first detection voltage with a first reference voltage and a second reference voltage to output the first checking signal to have a high level when the first detection voltage is higher than the first reference voltage and a low level when the first detection voltage is lower than the second reference voltage; and
an output selector configured to perform a logical AND operation on an enable signal and the first checking signal.

10. The touch sensing device of claim 8, wherein the first charging and discharging circuit comprises:
a first current source connected between a power supply voltage terminal and a ground;
a second current source connected between the first current source and the ground to be turned off when the first current source is turned on and be turned on when the first current source is turned off; and
a capacitor connected between an intermediate connection node between the first current source and the second current source and the ground to provide the first detection voltage by performing the charging operation when the first current source is turned on and performing the discharging operation when the second current source is turned on.

11. The touch sensing device of claim 8, wherein the second checking circuit comprises:
a second edge detector configured to output a second edge detection signal having a pulse generated during detection of an edge of the reference signal;
a second charging and discharging circuit configured to perform a charging operation and a discharging operation based on the second edge detection signal to generate a second detection voltage; and
a second comparison circuit configured to check whether the reference signal is normal, based on the second detection voltage, to output a second checking signal.

12. The touch sensing device of claim 11, wherein a pulse width of the pulse generated during the detection of the edge of the oscillation signal is shorter than a pulse width of the oscillation signal, and
a pulse width of the pulse generated during the detection of the edge of the reference signal is shorter than a pulse with of the reference signal.

13. The touch sensing device of claim 11, wherein each of the first and second charging and discharging circuits comprises:
a switch connected between a power supply voltage terminal and a ground;
a capacitor connected between the switch and the ground to perform a charging operation when the switch enters an ON state; and
a resistor connected between a connection node of the switch and the capacitor and the ground to provide a discharging path between the capacitor and the ground when the switch enters an OFF state.

14. The touch sensing device of claim 11, wherein the second comparison circuit comprises:
a window comparison circuit configured to compare the second detection voltage with a first reference voltage and a second reference voltage to output the second checking signal to have a high level when the second detection voltage is higher than the first reference voltage and a low level when the second detection voltage is lower than the second reference voltage; and
an output selector configured to perform a logical AND operation on an enable signal and the second checking signal.

15. The touch sensing device of claim 11, wherein the second charging and discharging circuit comprises:
a first current source connected between a power supply voltage terminal and a ground;
a second current source connected between the first current source and the ground to be turned off when the first current source is turned on and be turned on when the first current source is turned off; and
a capacitor connected between an intermediate connection node between the first current source and the second current source and the ground to provide the second detection voltage by performing the charging operation when the first current source is turned on and performing the discharging operation when the second current source is turned on.

16. An electronic device, comprising:
a switching unit including a first touch member disposed in a housing;
a sensing inductor disposed inside of the first touch member;
a sensing capacitor electrically connected to the first sensing inductor;
an oscillation circuit including the sensing inductor and the sensing capacitor and configured to generate an oscillation signal having a frequency varying depending on a touch input, including a touch-contact or touch-force, through the touch switching unit;
a reference signal generation circuit configured to generate a reference signal corresponding to a reference clock;
a signal processor configured to receive the reference signal from the reference signal generation circuit and detect whether a touch input has occurred, using the oscillation signal and the reference signal, to output a touch detection signal; and
a self-checking circuit configured to check whether each of the oscillation signal and the reference signal is normal, and provide a check result signal.

17. The electronic device of claim 16, wherein the self-checking circuit comprises:
a first checking circuit configured to check whether the oscillation signal is normal and provide a first checking signal; and
a second checking circuit configured to check whether the reference signal is normal and provide a second checking signal.

18. The electronic device of claim 17, wherein the first checking circuit comprises:
a first edge detector configured to output a first edge detection signal having a pulse generated during detection of an edge of the oscillation signal;
a first charging and discharging circuit configured to perform a charging operation and a discharging operation based on the first edge detection signal to generate a first detection voltage; and
a first comparison circuit configured to check whether the oscillation signal is normal, based on the first detection voltage, to output a first checking signal.

19. The electronic device of claim 18, wherein the first comparison circuit comprises:
a window comparison circuit configured to compare the first detection voltage with a first reference voltage and a second reference voltage to output a first checking signal to have a high level when the first detection voltage is higher than the first reference voltage and have a low level when the first detection voltage is lower than the second reference voltage; and
an output selector configured to perform a logical AND operation on an enable signal and the first checking signal.

20. The electronic device of claim 18, wherein the first charging and discharging circuit comprises:
a first current source connected between a power supply voltage terminal and a ground;
a second current source connected between the first current source and the ground to be turned off when the first current source is turned on and be turned on when the first current source is turned off; and
a capacitor connected between an intermediate connection node between the first current source and the second current source and the ground to provide the first detection voltage by performing the charging operation when the first current source is turned on and performing the discharging operation when the second current source is turned on.

21. The electronic device of claim 18, wherein the second checking circuit comprises:
a second edge detector configured to output a second edge detection signal having a pulse generated during detection of an edge of the reference signal;
a second charging and discharging circuit configured to perform a charging operation and a discharging operation based on the second edge detection signal to generate a second detection voltage; and
a second comparison circuit configured to check whether the reference signal is normal, based on the second detection voltage, to output a second checking signal.

22. The electronic device of claim 21, wherein a pulse width of the pulse generated during the detection of the edge of the oscillation signal is shorter than a pulse width of the oscillation signal, and
wherein a pulse width of the pulse generated during the detection of the edge of the reference signal is shorter than a pulse width of the reference signal.

23. The electronic device of claim 21, wherein each of the first and second charging and discharging circuits comprises:
a switch connected between a power supply voltage terminal and a ground;
a capacitor connected between the switch and the ground to perform a charging operation when the switch enters an ON state; and
a resistor connected between a connection node of the switch and the capacitor and the ground to provide a discharging path between the capacitor and the ground when the switch enters an OFF state.

24. The electronic device of claim 21, wherein the second comparison circuit comprises:
a window comparison circuit configured to compare the second detection voltage with a first reference voltage and a second reference voltage to output the second checking signal to have a high level when the second detection voltage is higher than the first reference voltage and have a low level when the second detection voltage is lower than the second reference voltage; and an output selector configured to perform a logical AND operation on an enable signal and the second checking signal.

25. The electronic device of claim 21, wherein the second charging and discharging circuit comprises:
- a first current source connected between a power supply voltage terminal and a ground;
- a second current source connected between the first current source and the ground to be turned off when the first current source is turned on and be turned on when the first current source is turned off; and
- a capacitor connected between an intermediate connection node between the first current source and the second current source and the ground to provide the second detection voltage by performing the charging operation when the first current source is turned on and performing the discharging operation when the second current source is turned on.

26. An electronic device, comprising:
a housing;
a touch member disposed on the housing; and
a circuit unit disposed inside the housing, wherein the circuit unit is configured to:
- generate an oscillation signal having a frequency varying depending on the touch input through the touch member;
- generate a reference signal corresponding to a reference clock;
- detect whether a touch input has occurred, using the oscillation signal and the reference signal, to output a touch detection signal;
- generate pulses corresponding to detected edges of the oscillation signal and the reference signal; and
- determine whether the oscillation signal and the reference signal are normal based on the pulses.

27. The electronic device of claim 26, wherein the circuit unit is further configured to:
- perform charging operations and discharging operations based on the pulses to generate detection voltages; and
- determine whether the oscillation signal and the reference signal are normal based on the detection voltages.

* * * * *